US008351268B2

(12) United States Patent
Ogawa et al.

(10) Patent No.: US 8,351,268 B2
(45) Date of Patent: Jan. 8, 2013

(54) SEMICONDUCTOR DEVICE AND CONTROL METHOD OF THE SAME

(75) Inventors: Akira Ogawa, Tokyo (JP); Masaru Yano, Tokyo (JP)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 13/253,634

(22) Filed: Oct. 5, 2011

(65) Prior Publication Data

US 2012/0069676 A1   Mar. 22, 2012

Related U.S. Application Data

(62) Division of application No. 12/819,071, filed on Jun. 18, 2010, now Pat. No. 8,045,388, which is a division of application No. 12/512,638, filed on Jul. 30, 2009, now Pat. No. 7,969,787, which is a division of application No. 11/478,554, filed on Jun. 28, 2006, now Pat. No. 7,596,032.

(30) Foreign Application Priority Data

Jun. 28, 2005 (JP) .................................. 2005/011815

(51) Int. Cl.
*G11C 11/34* (2006.01)

(52) U.S. Cl. ................ 365/185.2; 365/185.21; 365/207; 365/210.1

(58) Field of Classification Search ................ 365/185.2, 365/185.21, 207, 210.1
See application file for complete search history.

(56) References Cited

U.S. PATENT DOCUMENTS

| 6,097,633 | A | 8/2000 | La Placa |
| 6,259,633 | B1 | 7/2001 | Chen et al. |
| 6,799,256 | B2 | 9/2004 | Van Buskirk et al. |
| 6,975,543 | B2 | 12/2005 | Kurihara |
| 6,999,345 | B1 | 2/2006 | Park et al. |
| 7,061,804 | B2 * | 6/2006 | Chun et al. ................ 365/185.17 |
| 7,170,791 | B2 | 1/2007 | Iwase et al. |
| 7,184,348 | B2 * | 2/2007 | Crippa et al. .................. 365/207 |
| 2004/0066678 | A1 | 4/2004 | Oh et al. |
| 2004/0130946 | A1 | 7/2004 | Uribe et al. |
| 2004/0179396 | A1 | 9/2004 | Yamada |
| 2004/0257873 | A1 | 12/2004 | Shieh et al. |
| 2005/0281126 | A1 | 12/2005 | Kato |
| 2006/0050584 | A1 | 3/2006 | Gogl et al. |
| 2006/0077740 | A1 | 4/2006 | Lee et al. |
| 2006/0083070 | A1 | 4/2006 | Arakawa |

(Continued)

FOREIGN PATENT DOCUMENTS

JP        62058495 A       3/1987

(Continued)

*Primary Examiner* — Vu Le
*Assistant Examiner* — Han Yang

(57) ABSTRACT

The present invention provides a semiconductor memory and a control method therefor, the semiconductor device including a first current-voltage conversion circuit connected to a core cell provided in a nonvolatile memory cell array, a second current-voltage conversion circuit connected to a reference cell through a reference cell data line, a sense amplifier sensing an output from the first current-voltage conversion circuit and an output from the second current-voltage conversion circuit, a compare circuit comparing a voltage level at the reference cell data line with a predefined voltage level, and a charging circuit charging the reference cell data line, if the voltage level at the reference cell data line is lower than the predefined voltage level during pre-charging the reference cell data line. According to the present invention, the pre-charging period of the reference cell data line can be shortened, and the data read time can be shortened.

13 Claims, 11 Drawing Sheets

U.S. PATENT DOCUMENTS

2007/0035993 A1    2/2007    Tsukidate

FOREIGN PATENT DOCUMENTS

| | | |
|---|---|---|
| JP | 2000021188 A | 1/2000 |
| JP | 2001085373 A | 3/2001 |
| JP | 2001250391 A | 9/2001 |
| JP | 2002025286 A | 1/2002 |
| JP | 2002237193 A | 8/2002 |
| JP | 2003242898 A | 8/2003 |
| JP | 2004063059 A | 2/2004 |
| JP | 2004146582 A | 5/2004 |
| JP | 2004228519 A | 8/2004 |
| WO | 03088261 A1 | 10/2003 |

* cited by examiner

SEMICONDUCTOR DEVICE AND CONTROL METHOD OF THE SAME

CROSS-REFERENCES TO RELATED APPLICATIONS

This Divisional application claims the benefit of the co-pending, commonly-owned U.S. patent application Ser. No. 12/819,071, filed on Jun. 18, 2010, by Ogawa, et al., and titled "Semiconductor Device and Control Method Therefor", which is a Divisional application of commonly-owned U.S. patent application Ser. No. 12/512,638, filed on Jul. 30, 2008, by Ogawa, et al., and titled "Semiconductor Device and Control Method Therefor", which is a Divisional application of commonly-owned U.S. patent application Ser. No. 11/478,554, filed on Jun. 28, 2006, by Ogawa, et al., and titled "Semiconductor Device and Control Method Therefor", which is a continuation in part of International Application No. PCT/JP2005/011815, filed Jun. 28, 2005 which was not published in English under PCT Article 21(2).

BACKGROUND OF THE INVENTION

1. Field of the Invention

This invention relates generally to semiconductors and control methods therefor, and more particularly, to a semiconductor device having a non-volatile memory cell array and a control method therefor.

2. Description of the Related Art

In recent years, non-volatile memory semiconductor devices, in which data is rewritable, have been widely used, For instance, in a flash memory that is a typical non-volatile memory, a transistor composing a memory cell has a floating gate or an insulating film, each of which is also known as a charge storage layer. Data is stored by storing the charge in the charge storage layer. When the charge is stored in a trap layer, a threshold voltage of the transistor is changed. Data is read by reading the threshold voltage of the transistor as a drain current value.

There have been developed Silicon Oxide Nitride Oxide Silicon (SONOS) type flash memories in which the charge is stored in the trap layer made of a silicon nitride layer for purposes of higher memory capacity, in addition, among the flash memories, there has been developed a flash memory in which two or more charge storage regions are provided in one transistor in order to increase the memory capacity. An example is disclosed in Japanese Patent Application Publication No. 2000-514946 where two charge storage regions are provided between a gate electrode and a semiconductor substrate of a transistor. This transistor symmetrically operates switching a source and a drain. This realizes a virtual ground architecture in which a source region and a drain region are not distinguished.

FIG. 1 (PRIOR ART) is a view schematically illustrating data reading in a conventional technique. A core cell 12, which is a non-volatile memory cell, is arranged in a non-volatile memory cell array 10. In fact, multiple core cells are arranged. Yet, only one core cell is shown here. The source of the transistor in the core cell 12 is connected to ground, and the drain thereof is connected to a core cell data line 14. The core cell data line 14 is connected by a first current-voltage conversion circuit (cascode circuit) 16. There are also arranged multiple core cell data lines 14 and multiple first current-voltage conversion circuits 16 as a matter of fact, Yet, only one is respectively shown, In a similar manner, a reference cell 22 is connected to a second current-voltage conversion circuit (cascode circuit) 26 through a reference cell data line 24. An output from the first current-voltage conversion circuit 16 and an output from the second current-voltage conversion circuit 26 are input into a sense amplifier 18, so as to be sensed and output. There are also arranged multiple sense amplifiers 18. Yet, only one sense amplifier is shown here.

Data is read from the core cell 12 in a following manner. Firstly, the first current-voltage conversion circuit 16 pre-charges the core cell data line 14 to set the voltage level of the core cell data line 14 to a given voltage level. Then, current flows through the core cell 12, in accordance with the data written into the core cell 12. The first current-voltage conversion circuit 16 converts the current value into the voltage level to output to the sense amplifier 18.

The threshold voltage of the transistor in the reference cell 22 is a reference threshold voltage that determines whether the data in the core cell 12 is "1" or "0". In a similar manner as the core cell side, the second current-voltage conversion circuit 26 pre-charges the reference cell data line 24, and converts the current value of the reference cell 22 into the voltage level to output to the sense amplifier 18. The sense amplifier 18 compares the output from the first current-voltage conversion circuit 16 with the output from the second current-voltage conversion circuit 26, and provides an output according to whether the data written into the core cell is "1" or "0".

Japanese Patent Application Publication No. 2001-250391 discloses a circuit having a current-voltage conversion circuit for core cells and a current-voltage conversion circuit for reference cells, and an output from the current-voltage conversion circuit for the reference cells is input into the current-voltage conversion circuit for the core cells, U.S. Pat. No. 6,259,633 discloses a circuit having a transistor such that a current conversion circuit speeds up pre-charging.

Depending on the type of the non-volatile memory, data is concurrently read from multiple core cells 12 connected to an identical word line. For example, in a memory device having a memory array architecture of NOR type or virtual ground type and also having an interface identical to a NAND type flash memory, for example, 512 bits are concurrently read out of the core ceils connected to an identical word line, This read operation is performed 32 times in a continuous manner, each of such read out data (2 k bytes in total) is memorized in a register, and every 16 bits are output from the register to outside of the chip in a continuous manner. The first current voltage conversion circuit 16 and the sense amplifier 18 are provided for each core cell data line 14. Accordingly, when data is read out of the core cells 12 concurrently, the output from the second current-voltage conversion circuit 26 is input into each of the sense amplifiers 18. For example, when 512-bit data is concurrently read, 512 sense amplifiers 18 are connected.

Meanwhile, the outputs from the second current-voltage conversion circuit 26 are connected to 512 sense amplifiers 16. As stated, the second current-voltage conversion circuit 26 is connected by such a heavy load that it takes time to pre-charge an output line of the second current-voltage conversion circuit 26. This causes a problem that a data read time gets longer.

SUMMARY OF THE INVENTION

The present invention has been made in view of the above circumstances, and it is an object of the present invention to provide a semiconductor device that can shorten a pre-charging time of a reference cell data line and shorten a data read time, According to a first aspect of the present invention, there is preferably provided a semiconductor device including: a first current-voltage conversion circuit connected to a core cell provided in a nonvolatile memory cell array; a second current-voltage conversion circuit connected to a reference cell through a reference cell data line; a sense amplifier sensing an output from the first current-voltage conversion circuit and an output from the second current-voltage conversion circuit; a compare circuit comparing a voltage level at the reference cell data line with a predefined voltage level; and a charging circuit charging the reference cell data line, if the voltage level at the reference cell data line is lower than the predefined voltage level during pre-charging the reference cell data line. According to the present invention, when the reference cell-data line is pre-charged, not only the second current-voltage conversion circuit but also the charge circuit charge the reference cell data line. This enables the reference cell data line to be pre-charged at high speed. Accordingly, it is possible to provide a semiconductor device in which a data read time can be shortened.

According to a second aspect of the invention, there is provided a method of controlling a semiconductor device including: comparing a voltage level at a reference cell data line with a predefined voltage level; and charging the reference cell data line, if the voltage level at the reference cell data line is lower than the predefined voltage level during pre-charging the reference cell data line, the semiconductor device including a first current-voltage conversion circuit connected to a core cell provided in a nonvolatile memory cell array, a second current-voltage conversion circuit connected to the reference cell through a reference cell data line, and a sense amplifier sensing an output from the first current-voltage conversion circuit and an output from the second current-voltage conversion circuit. According to the present invention, when the reference cell data line is pre-charged, not only the second current-voltage conversion circuit but also the charge circuit charge the reference cell data line. This enables the reference cell data line to be pre-charged at high speed. Accordingly, it is possible to provide a semiconductor device in which a data read time can be shortened.

DETAILED DESCRIPTION

A description will now be given, with reference to the accompanying drawings, of embodiments of the present invention.

First Embodiment

Figure 1:
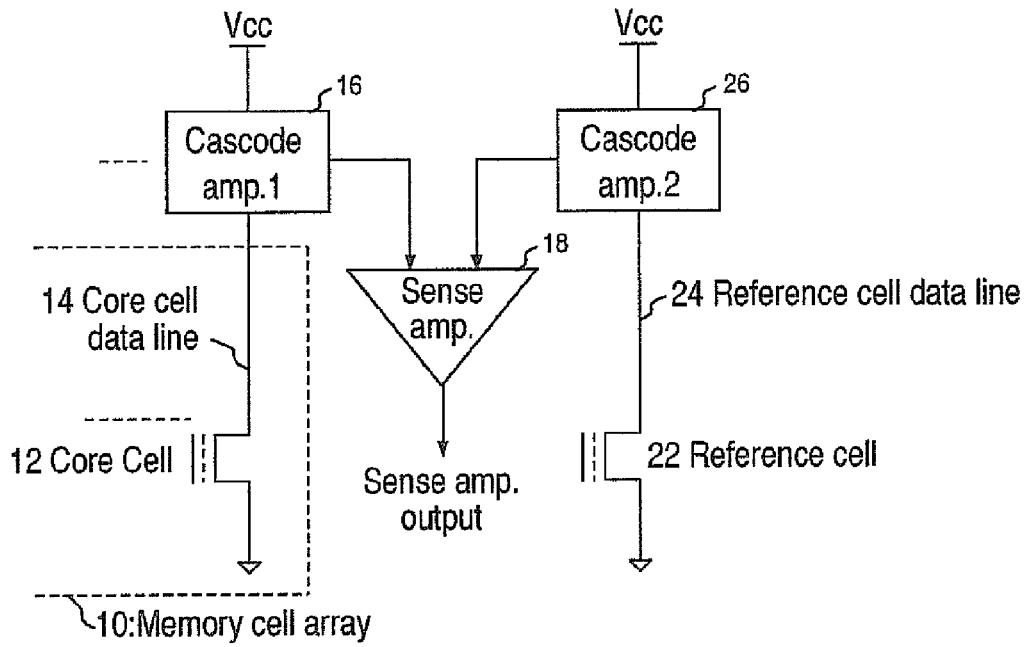
FIG. 1 (PRIOR ART) is a view schematically illustrating data reading in a conventional technique.
Figure 2:
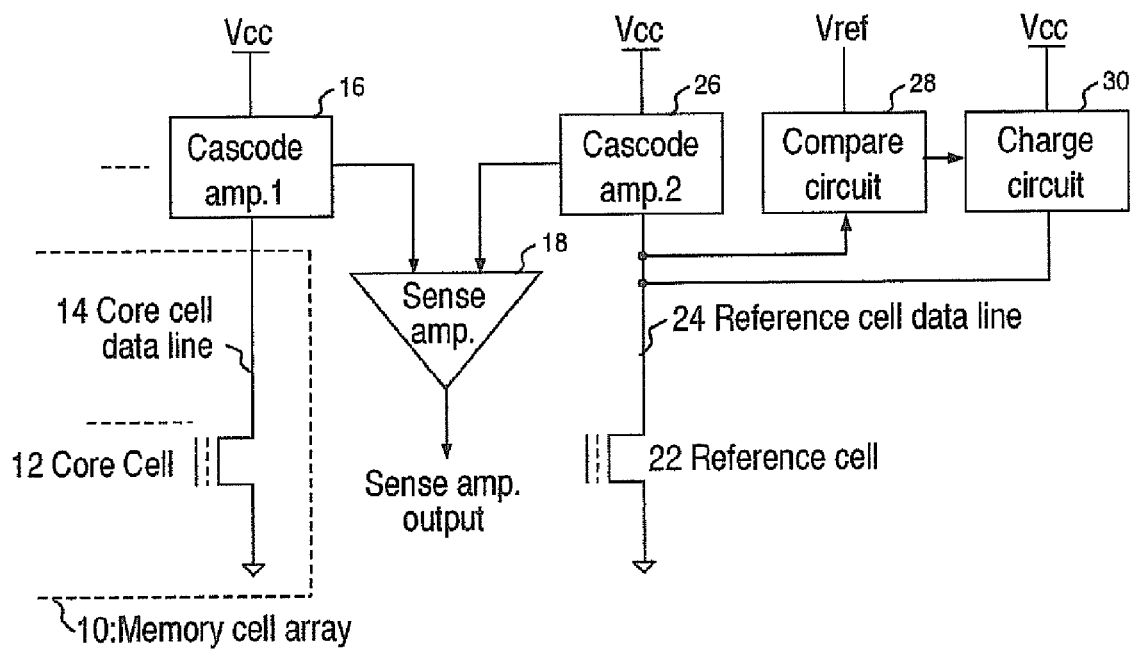
FIG. 2 is a block diagram illustrating a memory cell, a sense amplifier, and periphery thereof in a flash memory in accordance with a first embodiment of the present invention.

FIG. 2 is a block diagram of a memory cell, a sense amplifier, and periphery thereof in a non-volatile memory in accordance with a first embodiment of the present invention. A non-voltage memory cell array 10 includes a core cell 12, which is a non-volatile memory cell. Source of a transistor in the core cell 12 is connected to ground, and drain thereof is connected to a core cell data line 14. A first current-voltage conversion circuit (cascode circuit) 16 is connected to the core cell 12 through the core cell data line 14.

In a similar manner, a second current-voltage conversion circuit (cascode circuit) 26 is connected to a reference cell 22 through a reference cell data line 24. A sense amplifier 18 is connected by the first current-voltage conversion circuit 15 and by the second current-voltage conversion circuit 26 so that outputs therefrom are sensed. There are provided multiple core cells 12, multiple core cell data lines 14, multiple first current-voltage conversion circuit 16, and multiple sense amplifiers 18. However, only one of them is respectively shown here. The second current-voltage conversion circuit 26 outputs to multiple sense amplifiers 18.

In addition, there is provided a compare circuit 28 that compares a voltage level of the reference cell data line 24 with a given voltage level (Vref). There is also provided a charge circuit 30 that charges the reference cell data line 24 by means of an output from the compare circuit 28.

Data is read out of the core cell 12 in a similar manner as the conventional technique, except for a case where the reference cell data line 24 is pre-charged. When the reference cell data line 24 is pre-charged, the compare circuit 28 compares the voltage level of the reference cell data line 24 with the given voltage level (Vref). If the voltage level of the reference cell data line 24 is lower than Vref, a charge signal is output. Upon receiving the charge signal, the charge circuit 30 connects a voltage source (Vcc) to the reference cell data line 24 to charge the reference cell data line 24. This makes it possible to pre-charge the reference cell data line 24 by means of the charge circuit 30, in addition to the second current-voltage conversion circuit 26.

As described heretofore, when the reference cell data line 24 is pre-charged, not only the second current-voltage conversion circuit 26 having a heavy load and connected to multiple sense amplifiers 18 but also the charge circuit 30 charge the reference cell data line 24, This makes it possible to pre-charge the reference cell data line 24 at high speed. It is therefore possible to shorten the data read time.

By setting Vref at equal to or smaller than the desired voltage level of the reference cell data line 24 during pre-charging Vref, the voltage level of the reference cell data line 24 can be lowered than a desired voltage level, and the charge circuit 30 can be operated appropriately when charging by means of the charge circuit 30 is demanded.

Second Embodiment

A memory cell array employed in a second embodiment is a SONOS type non-volatile memory cell array, and employs a virtual ground array architecture, in a similar manner as Patent Document 1. The memory cell array is utilized as a memory device having an interface identical to the NAND type flash memory, and multiple bits (512 bits is employed in the second embodiment) are read concurrently from the core cells connected to an identical word line.

In the second embodiment, two bits can be stored in one core cell to increase the memory density. However, for easy explanation, a description will be given of a case where only one bit is stored in a core cell and one bit is read out of the core cell. A method of reading one bit out of two bits stored in the core cell can be realized by use of a reference having two different reference cells and by performing the following read operation.

Figure 3:
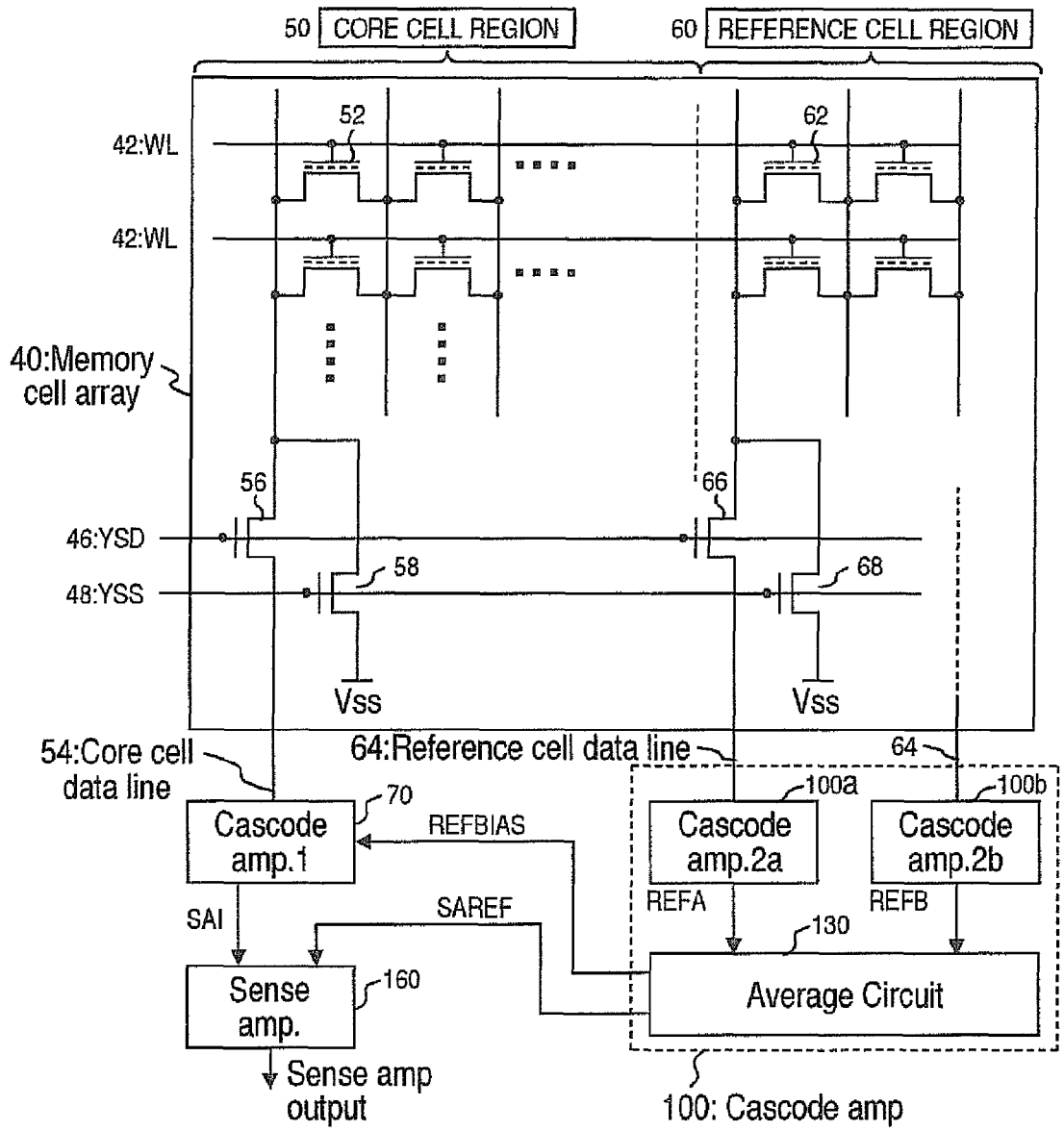
FIG. 3 is a block diagram illustrating memory cells, sense amplifiers, and periphery thereof in a flash memory in accordance with a second embodiment of the present invention.

FIG. 3 is a block diagram illustrating the memory cells, the sense amplifiers, and periphery thereof in a non-volatile memory in accordance with the second embodiment of the present invention. A non-volatile memory cell array 40 includes a core cell region 50 and a reference cell region 60. Core cells 52 are arranged in the core cell region 50 in rows and columns. The gates making up of the core cells 52 are respectively connected to word lines 42. The sources and drains thereof are connected to core cell data lines 54.

When a drain select line 46 (YSD) is at a high level, a drain select FET 56 is turned on and the core cell data line 54 is connected to a first current-voltage conversion circuit 70. When a source select line 48 (YSS) is at a high level, the core cell data line 54 is connected to ground (Vss). When the data is read out of the core cell 52, the core cell data line 54 is selected by the drain select line 46 (YSD) or the source select line 48 (YSS) in a timely manner. For example, when the data is read from the core cell 52, a voltage is applied to the word line 42 connected to the core cell 52 and the core cell data line 54 is connected to the first current-voltage conversion circuit 70. One end of the core cell data line 54 connected to the core cell 52 is also connected to Vss.

The first current-voltage conversion circuit 70 pre-charges the core cell data line 54 to, for example, 1.4 V. Then, the value of the current flowing through the core cell 52 is converted into the voltage level to output (SAI) to the sense amplifier 16. There are provided 512 first current-voltage conversion circuits 70 and 512 sense amplifiers 160, which are equal in number to 512 core cells 52, from which data is concurrently read.

Reference cells 62 arranged in the reference cell region 60 are connected to the word lines 42, which are also connected by the core cells 52. In addition, the reference cells 62 are connected to reference cell data lines 54, and the drain or the source is selected by a drain select FET 66 or a source select FET 68 in a timely manner. For example, when the data is read from the reference cell 62, the voltage is applied to the word line 42 connected to the reference cell 62, the reference cell data line 64 is connected to a second current-voltage conversion circuit A100a, and one end of the core cell data line connected to the core cell 52 is also connected to Vss.

In a SONOS type non-volatile memory cell, a charge loss is increased as the number of writing and erasing times is increased. Therefore, it is preferable that the reference cells 62 be arranged in the non-volatile memory cell array 40 and the numbers of writing and crazing times of the reference cells 62 be equal to those of the core cells 52. For this reason, it is preferable that the reference cells 62 be arranged in the non-volatile memory cell array 40 and connected to an identical word line 42.

The reference cell region 60 includes two reference cells 62 respectively corresponding to "1" and "0". The threshold voltage of the core cell 52 is determined with the use of an average value of the threshold voltages in the reference cells, so as to determine whether the data of the core cell 52 is "1" or "0". Accordingly, a second current-voltage conversion circuit 100 includes a second current-voltage conversion circuit A100a connected to the reference cell corresponding to "1", a second current-voltage conversion circuit B100b connected to the reference cell corresponding to "0", and an average circuit 130 that averages the outputs from the two reference cells respectively corresponding to "1" and "0".

The second current-voltage conversion circuit A100a and the second current-voltage conversion circuit B100b respectively pre-charge the reference cell data lines 64 to 1.4 V. The second current-voltage conversion circuit A100a and the second current-voltage conversion circuit B100b respectively include a compare circuit and a charge circuit, which are not shown in FIG. 3. However, the configurations and operations thereof will be described later in detail.

The second current-voltage conversion circuit A100a and the second current-voltage conversion circuit 810Db respectively convert the current value of the corresponding reference cell 62 into the voltage level, and respectively output REFA and REFB to the average circuit 130. The average circuit 130 averages such output value (REFA) from the second current-voltage conversion circuit A100a and that (REFB) from the second current-voltage conversion circuit B100b. As outputs from the second current-voltage conversion circuit 100, REFBIAS and SAREF are respectively output to the first current-voltage conversion circuit 70 and to the sense amplifier 160.

in this manner, it is possible to determine the data of the core cell 52 with more accuracy, by providing the reference cells for "1" and "0" and averaging the outputs thereof to output from the second current-voltage conversion circuit 100, no matter how the threshold voltage distribution is changed by a charge loss, it is possible to use, for example, one reference cell having an intermediate threshold voltage between '1' and '0', instead of using the multiple reference cells used in the second embodiment, in this case, the second current-voltage conversion circuit A100a may be set to the output from the current-voltage conversion circuit 100, without using the average circuit 130. In addition, three or more reference cells are included and the average circuit 130 may average the outputs from the three or more reference cells.

Figure 4:
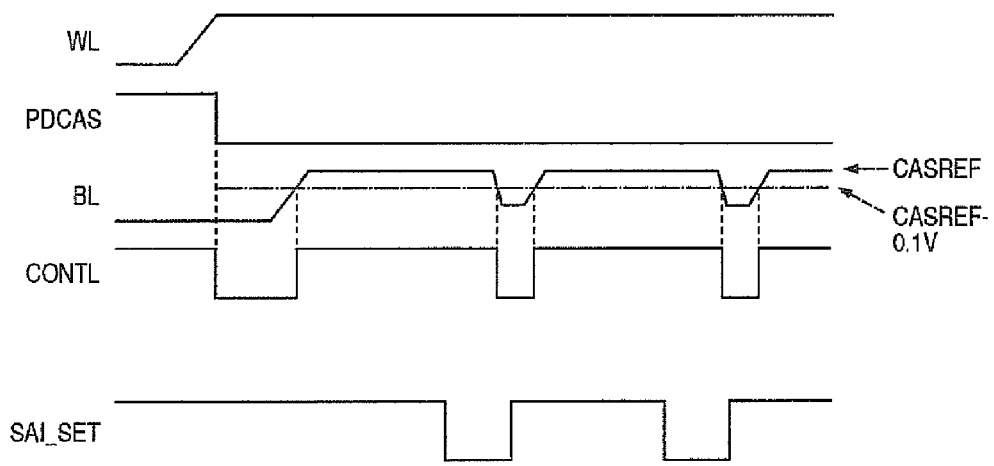
FIG. 4 shows a timing chart while data is being read from a core cell of the flash memory in accordance with the second embodiment of the present invention.

FIG. 4 shows a timing chart while data is being read. FIG. 4 shows a word line signal (WL), a switch signal (PDCAS) of the first current-voltage conversion circuit 70 and the second current-voltage conversion circuit 100, a voltage level (BL) of the reference cell data line 54, an output signal (CCNTL) of the compare circuit, and an input signal (SAI_SET) of a sense control circuit.

Figure 5:
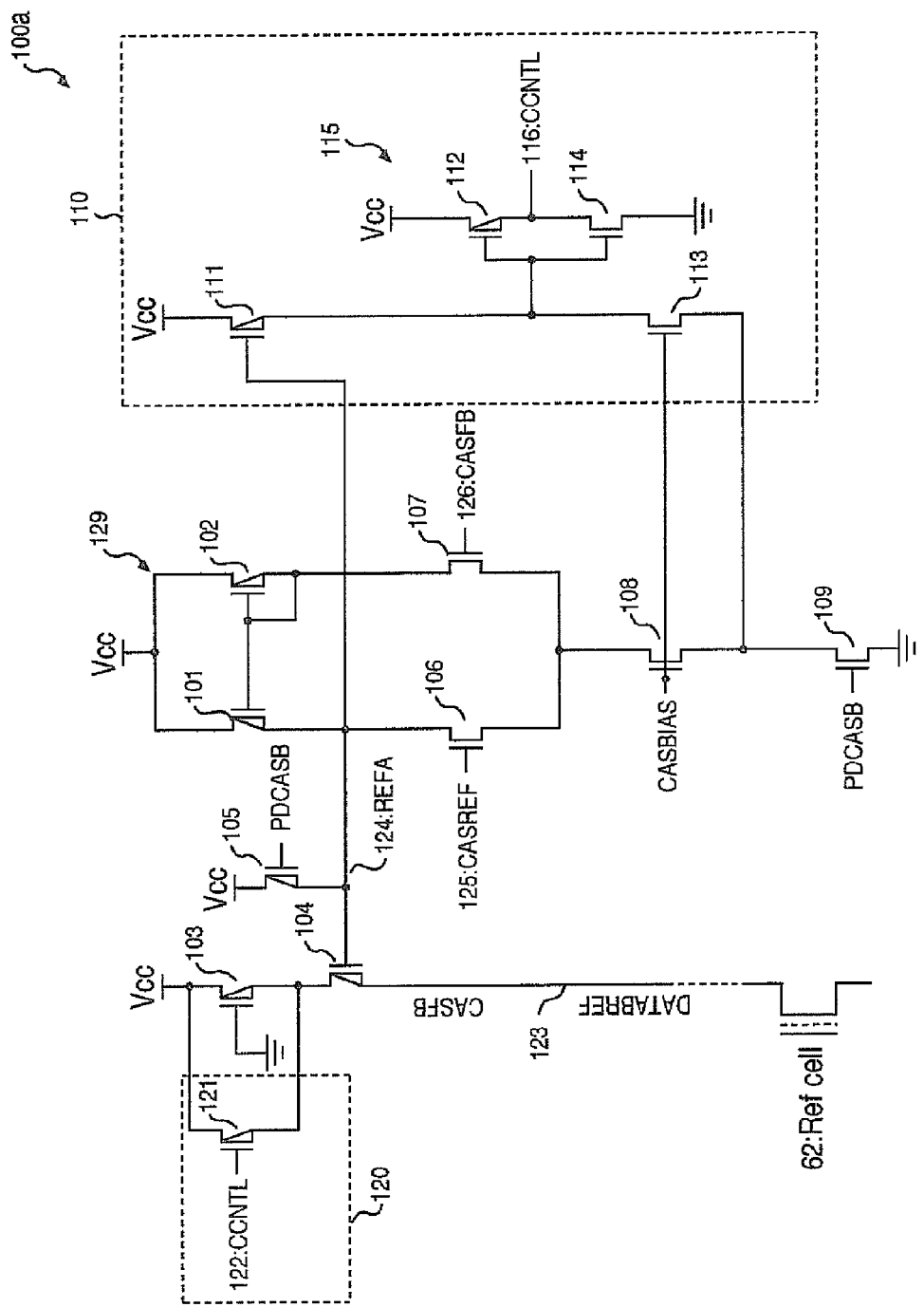
FIG. 5 is a circuit diagram of a second currant-voltage conversion circuit of the flash memory in accordance with the second embodiment of the present invention.

FIG. 5 is a circuit diagram of the second current-voltage conversion circuit A100a. The second current-voltage conversion circuit 810Db has a similar circuit, and an explanation is omitted. Signal from the reference cell data line 64 is DATABREF, and is connected to a node 123 to become CASFB. A differential circuit 129 is composed of P-FETs 101 and 102, and N-FETs 106, 107, and 108, and is provided between the voltage source Vcc and the ground. The differential circuit 129 is a current mirror type differential circuit, in which a reference voltage level (CASREF) is input into the gate (a node 125) of the FET 106, and a voltage level (CASFB) of the reference cell data line 64 is input into the gate (a node 126) of the FET 107. The FET 108 serves as a current source that adjusts current flowing through the differential circuit 129. A given reference voltage CASBIAS is applied to the gate of the FET 108, the source thereof is connected to the ground, and the drain thereof is connected to the FET 106 and to the FET 107, The FET 109 is connected between the FET 108 and the ground, and a switch signal (PDCASB: a complementary line of PDCAS) is input into the gate of the FET 109 to turn on or off the differential circuit.

An output signal (REFA) of the differential circuit 129 is output to a node 124. The output signal (REFA) of the differential circuit 129 is connected to the gate of a P-FET 104. The source of the P-FET 104 is connected to the voltage source Vcc through a P-FET 103 having the gate connected to ground, and the drain the P-FET 104 is connected to the reference cell data line 64. A P-FET 105 is connected between the voltage source Vcc and the node 124. This circuit is turned on or off by feeding a switch signal (PDCASB) to the gate of the P-FET 105.

With the above-described circuits, while the switch signal (PDCASB) is at a high level, if the voltage level (CASFB) of the reference cell data line 64 is tower than the reference voltage level (CASREF), current flowing through the FET 104 is increased and the reference data line 64 is charged. When the voltage level (CASFB) of the reference cell data line 54 is higher than the reference voltage level (CASREF), the current flowing through the FET 104 is decreased, in this manner, the reference cell data line 64 is pre-charged to the reference voltage level (CASREF). Here, the reference voltage level is set to 1.4 V.

A REFBIAS 136a and a SAREF 13Gb, however, are respectively connected to 512 first current-voltage conversion circuits 70 and to 512 sense amplifiers 160. Accordingly, it takes time to stabilize the voltage of the REFBIAS 136a and that of the SAREF 136b, after sense operation starts. In the second embodiment, there are further provided a compare circuit 110 and a charge circuit 120. The compare circuit 110 includes P-FETs 111 and 112 and N-FETs 113 and 114. The gate of the FET 111 is connected by an output from the differential circuit 129, the source thereof is connected to the voltage source Vcc, and the drain thereof is connected to an output node 128. The gate of the FET 113 is connected by a gate input (CASBIAS) of the FET 108 that serves as a current source of the differential circuit 129, the source of the FET 113 is connected to the ground, and the drain of the FET 113 is connected to the output node 128. The output node 128 inverts a signal via an inverter 115, and outputs (CCNTL) such inverted signal to an output node 116 of the compare circuit 110.

An output timing of the compare circuit 110 is determined by a difference in a ratio of W (gate width) of the FET 111 and that of the FET 113 and a ratio of W (gate width) of the FET 102 and that of the FET 108. Assuming that the aforedescribed two ratios are almost identical, if the voltage level (CASFB) of the reference cell data line 64 is lower than 1.4 V of the reference voltage level (CASREF) the output signal (CCNTL) becomes a low level. If it is higher, the output signal (CCNTL) becomes a high level. In the second embodiment, it is configured in such a manner that W of the FET 113 is formed slightly greater and the voltage level (CASFB) is set to 1.3 V that is slightly lower than the reference voltage level (CASREF), so that the output signal (CCNTL) is switched.

In one embodiment, the voltage level to be switched by the compare circuit 110 is slightly lower than the reference voltage level (CASREF). During the sense operation, if the charge circuit 120 keeps on, the load is changed and an accurate sensing is difficult. Accordingly, the voltage level is determined by the pre-charging time and the timing when the charge circuit 120 does not turn on during the sense operation.

As stated, the voltage level (a given voltage level) to be switched can be determined by selecting the ratio of W (gate width) of the FET 111 and that of the FET 113 and the ratio of W of the FET 102 and that of the FET 108. Then, the voltage level (CASF8) of the reference cell data line 64 and the given voltage level are compared. if the voltage level (CASFB) of the reference cell data line 64 is lower than the given voltage level, the low level is output. If it is higher, the high level is output, A charge circuit 120 (Tr1) includes a P-FET 121. A gate node 122 of the FET 121 is connected by the output (CCNTL) of the compare circuit 110, the source thereof is connected to the voltage source Vcc, and the drain thereof is connected to the reference cell data line 64 through the FET 104. If the output from the compare circuit 110 is at a low level, the voltage source Vcc is connected to the FET 104 and the reference cell data line 64 is charged.

Referring now to FIG. 4, when the word line (WL) is at a high level and the switch signal (PDACAS) is turned on (at a low level), the second current-voltage conversion circuit A100a starts pre-charging the reference cell data line (BL). In the beginning, the reference cell data line (BL) is lower than a given voltage level, that is, the reference voltage level (CASREF) −0.1 V, and the output signal (CCNTL) of the compare circuit 110 is at a low level. Accordingly, the charge circuit 120 is turned on and pre-charging is performed. When the reference cell data line (BL) reaches the reference voltage level (CASREF) −0.1 V. the output signal (CCNTL) of the compare circuit 110 becomes a high level and the charge circuit 120 is turned off. When the reference cell data line (BL) becomes stable, the cone cell data line 54 is pre-charged by the first current-voltage conversion circuit 70.

As stated heretofore, the non-volatile memory employed in the second embodiment includes the compare circuit 110 and the charge circuit 120. If the voltage level (CASFB) of the reference cell data line 64 is lower than the given voltage level (1.3 V), the compare circuit 110 outputs a low level to the charge circuit. Then, the charge circuit 120 is turned on and the reference cell data line 64 is charged. In this manner, also in a case where 512 sense amplifiers 18 are connected to an output of the second current-voltage output circuit 100, it is possible to pre-charge the reference cell data line 64 promptly. Accordingly, the data read time can be shortened, In addition, it is possible to compose the charge circuit with ease by composing the charge circuit 120 with an FET. Furthermore, it is possible to compose the compare circuit with ease by utilizing the output from the differential circuit of the second current-voltage conversion circuit A100a.

The value of the current flowing through the reference cell 62 is output from the second current-voltage conversion circuit Alcoa, as the voltage level (REFA) of the gate that corresponds to the value of the current flowing through the FET 104. In a similar manner, the voltage level (REFB) is output from the second current-voltage conversion circuit B100b.

Figure 6:
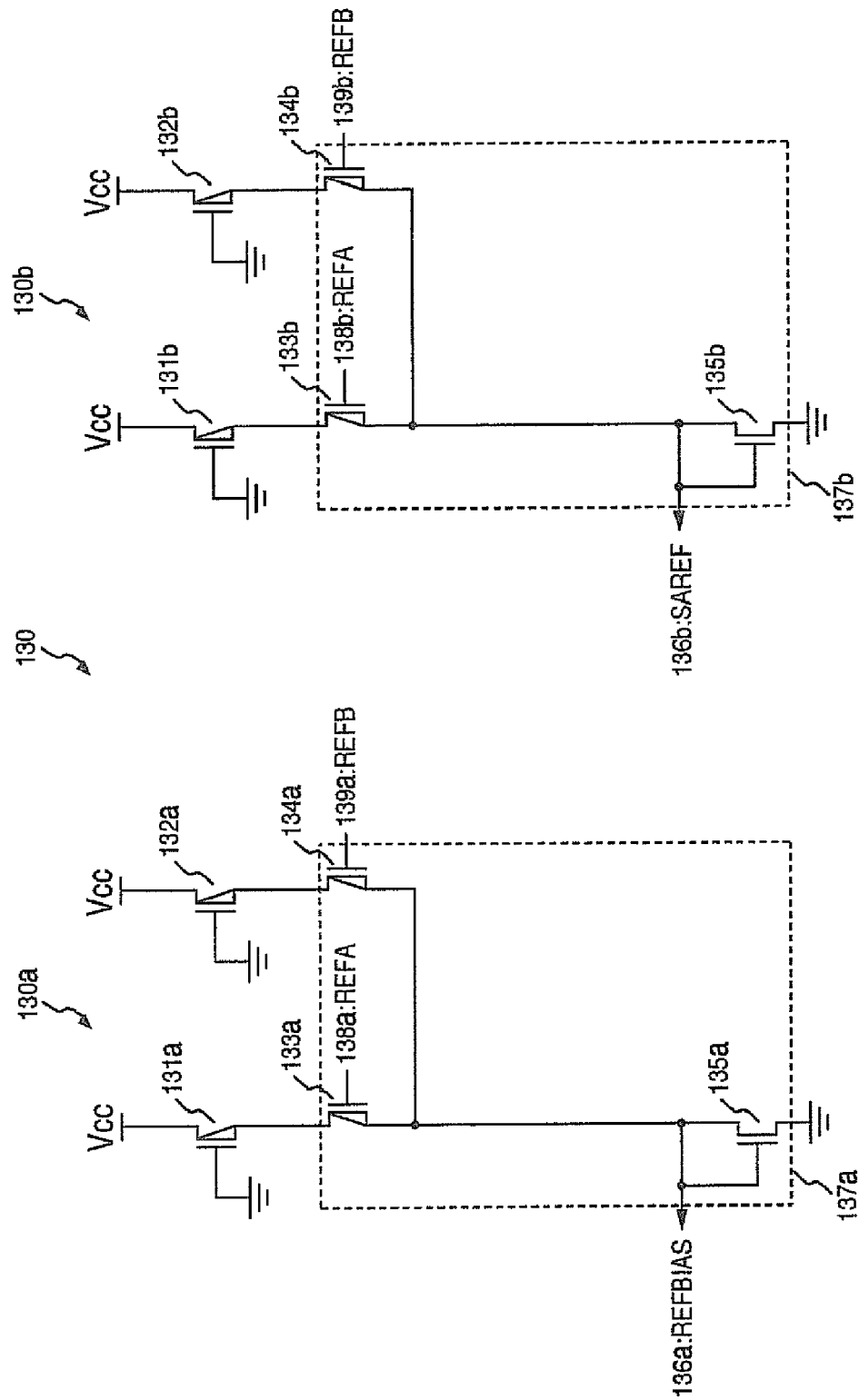
FIG. 6 is a circuit diagram of an average circuit of the flash memory in accordance with the second embodiment of the present invention.

FIG. 6 is a circuit diagram of the average circuit 130. Average circuits 130a and 130b are identical, except that outputs thereof are different, respectively REFBIAS and SAREF. The average circuit 130a includes P-FETs 131a, 132b, 133a, and 134a, and an N-FET 135a. The FETs 131a and 133a serves as current sources with the gates thereof connected to ground. REFA and REFB are respectively applied to the gate of the FET 138a and to that of the FET

139*a*, The FETs 131*a* and 132*a* are respectively connected to the source of the FET 138*a* and to that of the FET 139*a*. The drains thereof are connected to an output node 136*a*. The gate and drain of the FET13Sa are connected to the output node 136*a*, and the source thereof connected to ground. Accordingly, the FET 135*a* functions as a diode. With the configuration described heretofore, the currents flowing through the FET 133*a* and the FET 134*e*, to which REFA and REFB are respectively input, are integrated and output. In this manner, an average of the output (REFA) of the second current-voltage conversion circuit A100*a* and the output (REF8) of the second current-voltage conversion circuit 810Db, which equals to the output from the average circuit 130, is output from the second current-voltage conversion circuit 100.

The average circuit 130*b* operates in a similar manner as the average circuit 130*a*, so an explanation is omitted here. The output signal (REFBIAS) of the average circuit 130*a* (first average circuit) is output to the first current-voltage conversion circuit 70, and the output signal (SAREF) of the average circuit 130*b* (second average circuit) is output to the sense amplifier 160. Here, the average circuits may be integrated into one average circuit having separated outputs REFBIAS and SAREF, However, the two average circuits make it possible to prevent a noise generated by one of REFBIAS and SAREF from influencing the other.

Figure 7:
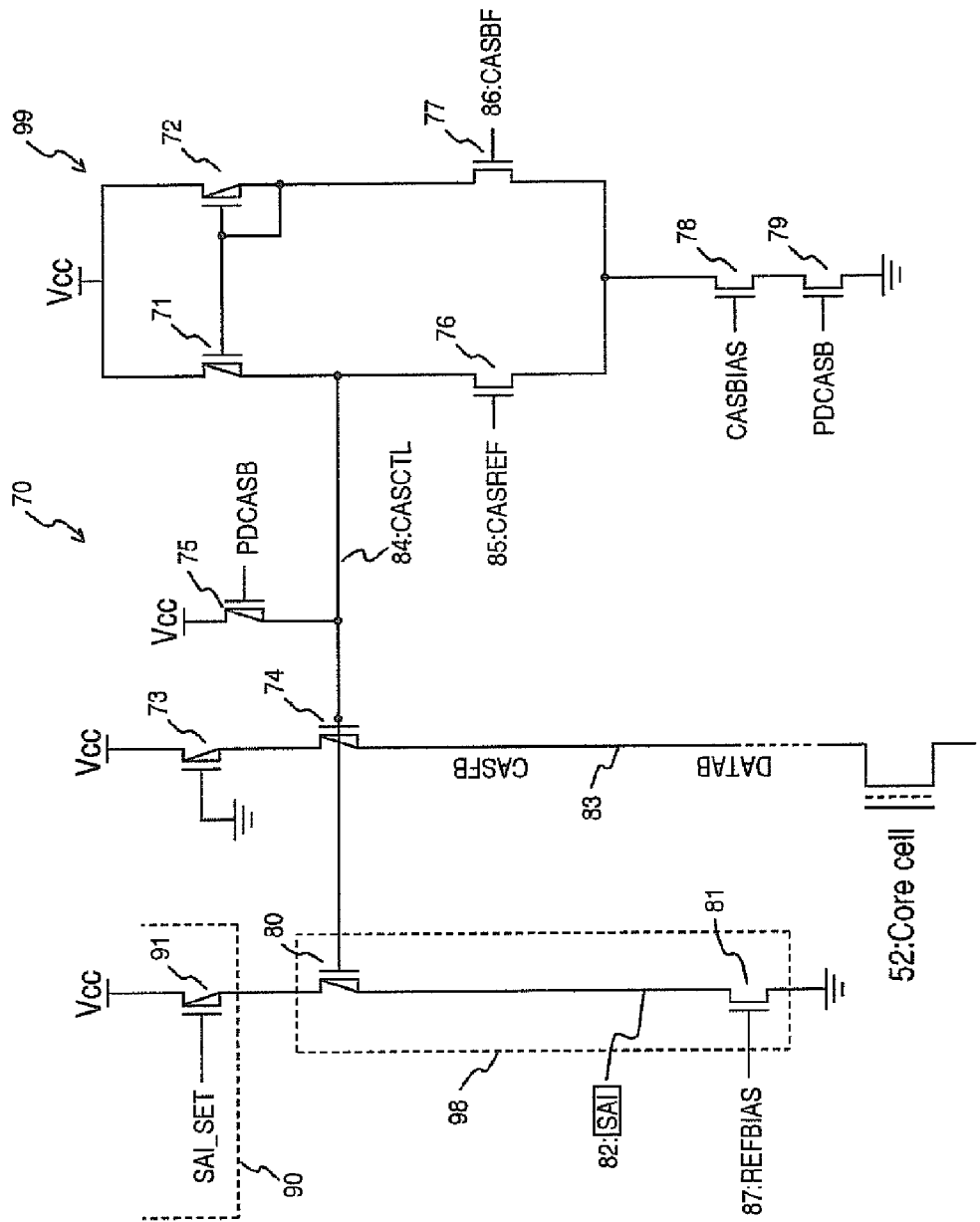
FIG. 7 is a circuit diagram of a first current-voltage conversion circuit of the flash memory in accordance with the second embodiment of the present invention.

FIG. 7 is a circuit diagram of the first current-voltage conversion circuit 70. The core cell data line 54 is connected to a node 83, and a voltage level thereof (DATAB) is CASFB, A current mirror type differential circuit 99 having P-FETs 71 and 72, and N-FETs 76, 86, and 78 is provided, so the reference voltage level (CASREF) and the voltage level (CASFB) of the core cell date tine 54 are respectively applied to inputs 76 and 77, and CASCTL is output to a node 84. The FET 78 and the FET 79 have functionalities identical to these of the FET 108 and the FET 109. In addition, the first current-voltage conversion circuit 70 includes P-FETs 73, 74, 75, and 80, and an N-FET 81. The P-FETs 73, 74, and 75 respectively have functionalities identical to those of the FETs 103, 104, and 105, shown in FIG. 5. That is to say, when the voltage level of the core cell data line 54 is lower than the reference voltage level (CASREF), the current flowing through the FET 74 is increased and the voltage level of the core cell data line 54 is set to the reference voltage level (CASREF). Here, the reference voltage level (CASREF) is 1.4 V. Here, the P-FET 73 is provided for suppressing the peak current while the core cell data line 54 is being charged. This makes it possible to suppress total charge current to be equal to or lower than a given value, while multiple core cells are concurrently being read.

The gate of the P-FET 80 is connected to the node 84, the source thereof to the voltage source Vcc through a sense control circuit 90, and the drain thereof to an output node 82 of the first current-voltage conversion circuit 70. The gate of the N-FET 81 is connected to the output (REFBIAS) from the second current-voltage conversion circuit 100, the source thereof to ground, and the drain thereof to the node 82, Here, a differential circuit is formed by a circuit 98 having the FETs 80 and 81 and a circuit 137*b* haying the FETs 133*a*, 134*a*, and 135*a* shown in FIG. 6. This differentially amplifies a level (CASCTL) of the node 84 and the average value of REFA and REFB. Then, the output signal (SAI) of the first current-voltage conversion circuit 70 is fed to the sense amplifier 160, That is to say, the first current-voltage conversion circuit 70 differentially amplifies the output from the core cell 52 and the output from the second current-voltage conversion circuit 100 to output to the sense amplifier 150. This makes it possible to amplify the difference between the data on the core cell side and that on the reference cell side, before a final amplification operation is performed on the sense amplifier 160, thereby enabling the data of the core cell 52 to be read with more certainty.

The second current-voltage conversion circuit 100 may be output only to the sense amplifier 160 to reduce the circuit area, and the data may be read from the core cell 52 by means of the output from the first current-voltage conversion circuit 70 and by means of the output from the second current-voltage conversion circuit 100 on the sense amplifier 160.

The first current-voltage conversion circuit 70 further includes the sense control circuit 90. The sense control circuit 90 includes a P-FET 91. The gate of the FET 91 is connected to the input signal (SAI_SET), the source thereof to the voltage source Vcc, and the drain thereof to the FET 80 (namely, the output node 82 of the first current-voltage conversion circuit 70). When the input signal (SAI_SET) is becomes a low level, the sense control circuit 90 turns on and outputs the output signal (SAI) to the sense amplifier 150. in other words, after pre-charging of the reference cell data line 64 finishes (for example, the voltage of the reference cell data line 64 becomes stable), if a low level is applied to the input signal (SAI_SET), the sense control circuit 90 turns on the output of the first current-voltage conversion circuit 70 to cause the sense amplifier 160 to start sensing.

After the pre-charging of the reference cell data line 54 finishes, the reason the first current-voltage conversion circuit 70 is turned on is described below. If the first current-voltage conversion circuit 70 is also turned on at the time of beginning pre-charging the reference cell data line 64, the voltage of SAI is unstable and in some cases, the voltage of SAI is increased to a relatively high level. At this time, the FET 81 flows current to ground so as to reduce SAI to a stable potential region. However, a gate node 87 the FET 81 is connected to the gate node 136*a* of the FET 135*a* that functions as a diode, So, the node 87 is not increased to a very high level and the FET 81 is low in the current supply capacity. Accordingly, it takes time to reduce the voltage of SAI that has been increased to a high voltage level, thereby making the sense operation longer. It is therefore possible to perform the sense operation by the sense amplifier 160 with the use of the voltages (REFBIAS and SAREF) on the reference side in a stable condition, by turning on the first current-voltage conversion circuit 70 after the pre-charging of the reference cell data line 64 is completed. This realizes accurate and precise sense operation.

Referring to FIG. 4 again, when the input signal (SAI_SET) of the sense control circuit 90 becomes a low level, the sense control circuit 90 is turned on, the output signal (SAI) is output, and the sense operation is performed on the sense amplifier 160, Then, the sense operation is completed, and the input signal (SAI_SET) of the sense control circuit 90 becomes a high level. The next core cell is selected and the sense operation is performed in a similar manner.

Figure 8:
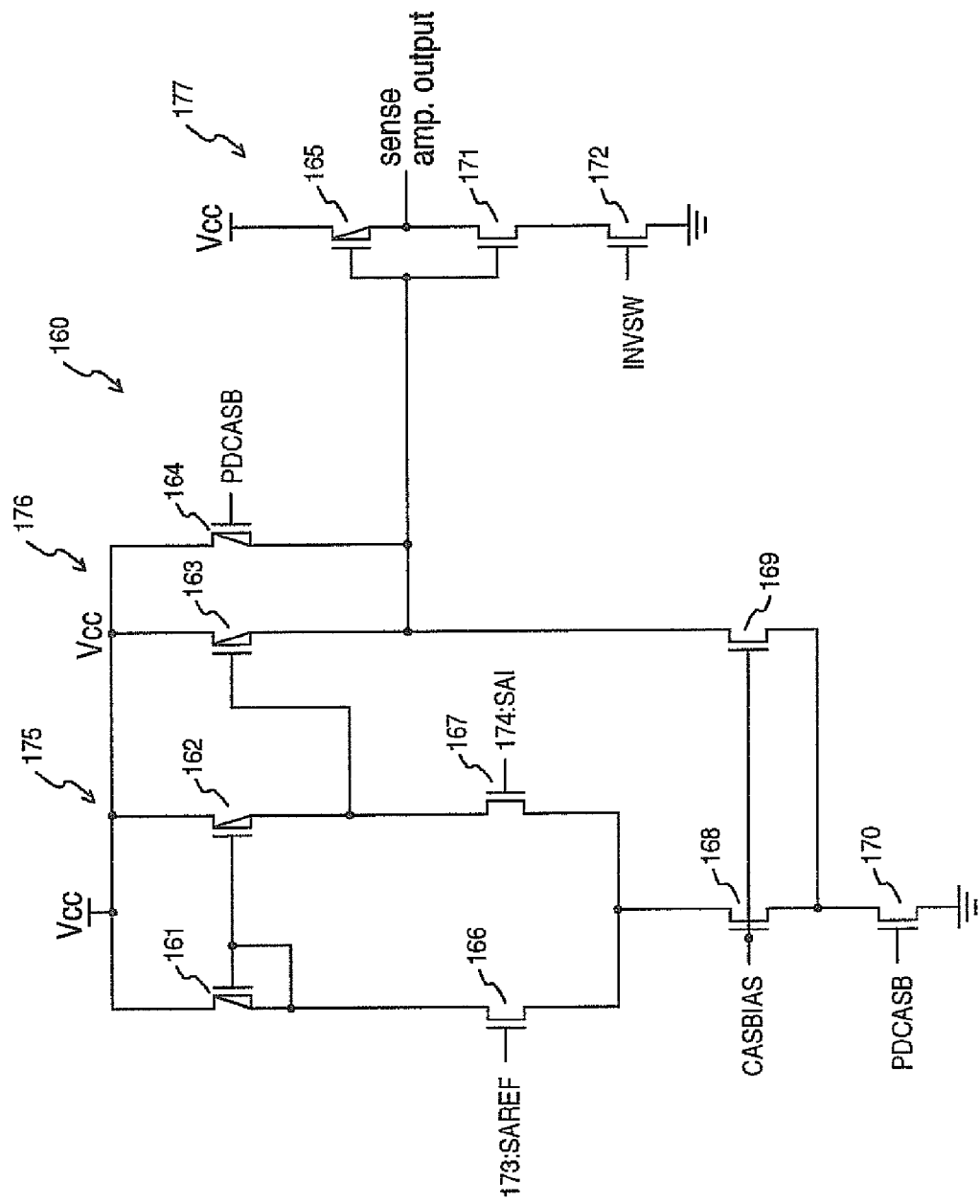
FIG. 8 is a circuit diagram of the sense amplifier of the flash memory in accordance with the second embodiment of the present invention.

FIG. 8 is a circuit diagram of the sense amplifier 160. The sense amplifier 160 includes a current mirror type differential circuit 175 having P-FETs 161 and 162 and N-FETs 165, 167, and 168, an amplifier circuit 175 having a P-FET 153 and an N-FET 169, and an inverter 177 having a P-FET 165 and an N-FET 171. The FETs 164, 170, and 172 serve as switches, which turn on the sense amplifier by means of switch signals PDCASB and INVSW.

The output (SAI) from the first current-voltage conversion circuit 70 and the output (SAREF) from the second current-voltage conversion circuit 100 are respectively input into inputs 174 and 173 of the differential circuit 175. If the output signal (SAI) of the first current-voltage conversion circuit 70 is lower than the output signal (SAREF) of the second current-voltage conversion circuit 100, the amplifier circuit 176 outputs a low level and the inverter 177 outputs a high level. If SAI is higher than SAREF, the amplifier circuit 176 outputs a high level, and the inverter 177 outputs a low level.

As stated, the value of the current flowing through the core cell 52 is compared with the value of the current flowing through the reference cell 62, by comparing the output signal (SAI) of the first current-voltage conversion circuit 70 and the output signal (SAREF) of the second current-voltage conversion circuit 100, so as to determine whether the core cell 52 has "1" or "0".

Figure 9:
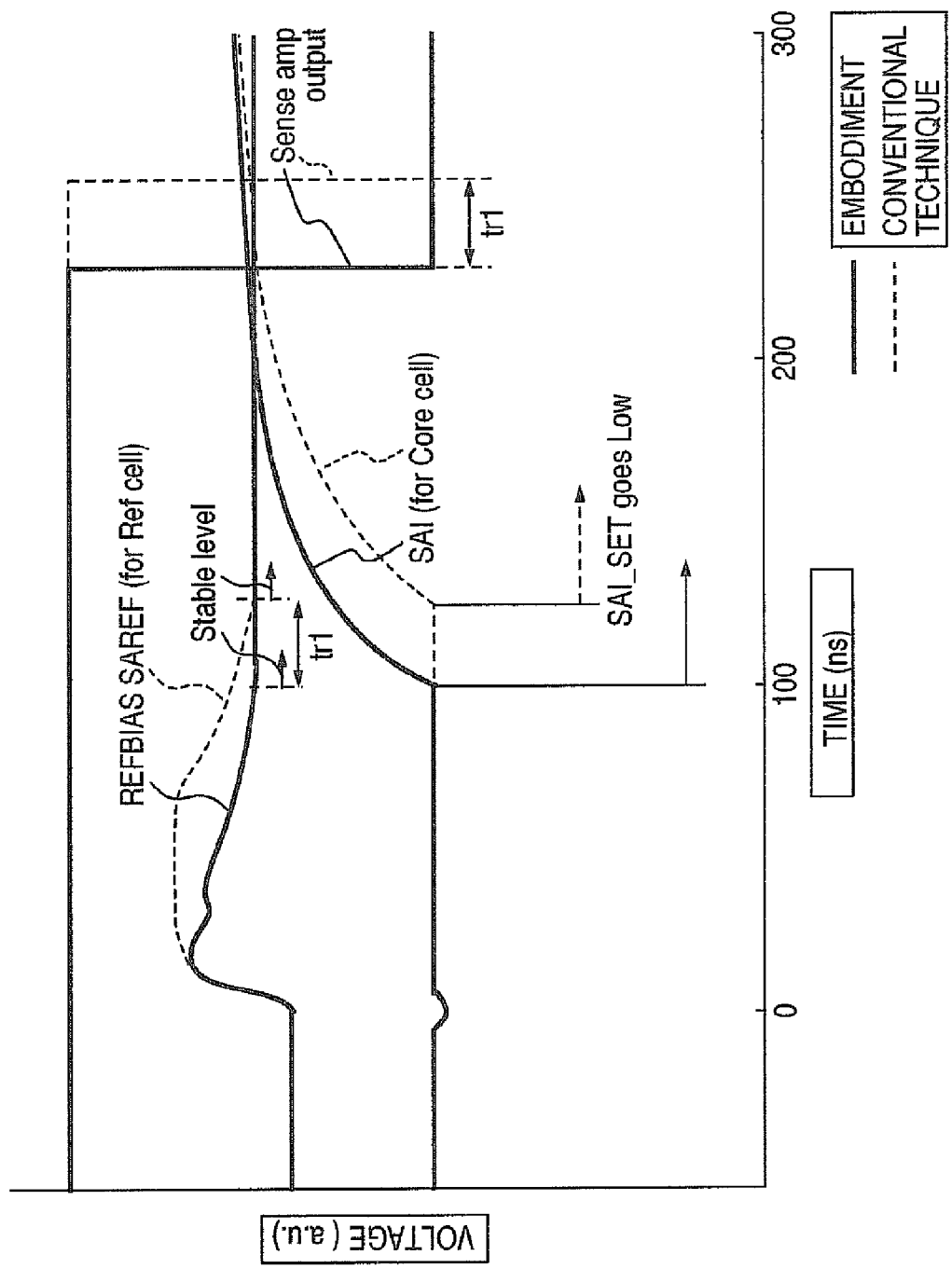
FIG. 9 is a graph showing measurement results of time dependency of the output signals while data is being read from the core cell of the flash memory in accordance with the second embodiment of the present invention.

FIG. 9 is a graph showing measurement results of time dependency of the output signals (REFBIAS and SAREF) of the second current-voltage conversion circuit 100 and the output signal (SAI) of the first current-voltage conversion circuit 70. The horizontal axis represents time, and the vertical axis represents voltage. The solid line indicates the results measured in accordance with the second embodiment, and the dashed line indicates the results of a case where neither the compare circuit 110 nor the charge circuit 120 is included.

Embodiments of the present claimed subject matter generally relates to semiconductor devices. More particularly, embodiments allow semiconductor devices to function with increased efficiency. In one implementation, the claimed subject matter is applicable to flash memory and devices that utilize flash memory. Flash memory is a form of non-volatile memory that can be electrically erased and reprogrammed. As such, flash memory, in general, is a type of electrically erasable programmable read only memory (EEPROM).

Like Electrically Erasable Programmable Read Only Memory (EEPROM), flash memory is nonvolatile and thus can maintain its contents even without power. However, flash memory is not standard EEPROM. Standard EEPROMs are differentiated from Flash memory because they can be erased and reprogrammed on an individual byte or word basis while flash memory can be programmed on a byte or word basis, but is generally erased on a block basis. Although standard EEPROMs may appear to be more versatile, their functionality requires two transistors to hold one bit of data. In contrast, flash memory requires only one transistor to hold one bit of data, which results in a lower cost per bit. As flash memory costs far less than EEPROM, it has become the dominant technology wherever a significant amount of non-volatile, solid-state storage is needed, Exemplary applications of flash memory include digital audio players, digital cameras, digital video recorders, and mobile phones. Flash memory is also used in USB flash drives, which are used for general storage and transfer of data between computers. Also, flash memory is gaining popularity in the gaming market, where low-cost fast-loading memory in the order of a few hundred megabytes is required, such as in game cartridges. Additionally, flash memory is applicable to cellular handsets, smartphones, personal digital assistants, set-top boxes, digital video recorders, networking and telecommunication equipments, printers, computer peripherals, automotive navigation devices, and gaming systems.

As flash memory is a type of non-volatile memory, it does not need power to maintain the information stored in the chip. In addition, flash memory offers fast read access times and better shock resistance than traditional hard disks. These characteristics explain the popularity of flash memory for applications such as storage on battery-powered devices (e.g., cellular phones, mobile phones, IP phones, wireless phones).

Flash memory stores information in an array of floating gate transistors, called "cells", each of which traditionally stores one bit of information. However, newer flash memory devices, such as MirrorBit Flash Technology from Spansion Inc., can store more than 1 bit per cell. The MirrorBit cell doubles the intrinsic density of a Flash memory array by storing two physically distinct bits on opposite sides of a memory cell. Each bit serves as a binary bit of data (e.g., either 1 or 0) that is mapped directly to the memory array. Reading or programming one side of a memory cell occurs independently of whatever data is stored en the opposite side of the cell.

With regards to wireless markets, flash memory that utilizes MirrorBit technology has several key advantages. For example flash memory that utilizes MirrorBit technology are capable of burst-mode access as fast as 80 MHz, page access times as fast as 25 ns, simultaneous read-write operation for combined code and data storage, and low standby power (e.g., 1 μA).

Figure 10:
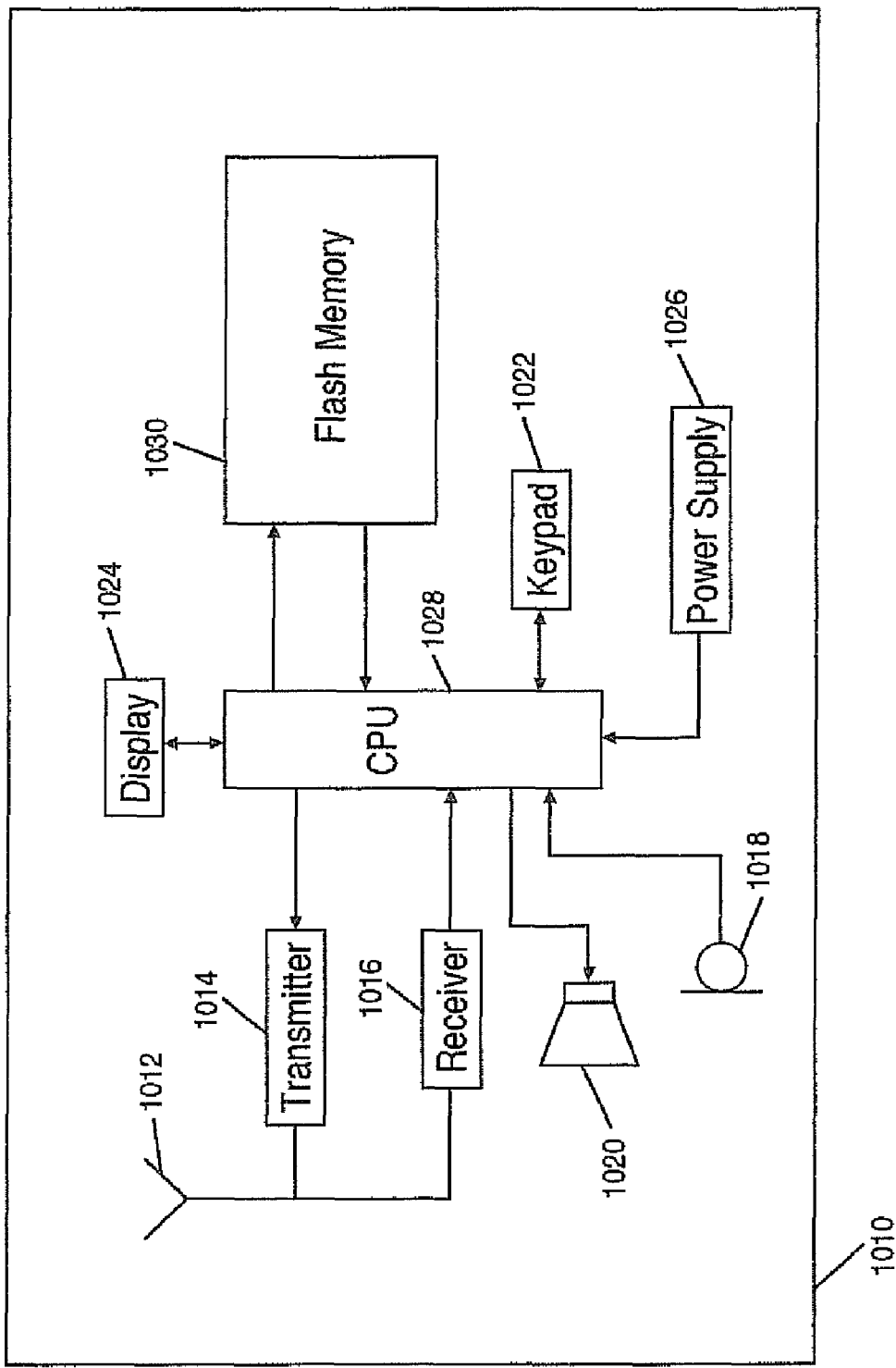
FIG. 10 illustrates a block diagram of a conventional portable phone, upon which embodiments can be implemented.

FIG. 10 shows a block diagram of a conventional portable telephone 1010 (a.k.a. cell phone, cellular phone, mobile phone, internet protocol phone, wireless phone, etc.), upon which embodiments can be implemented. The cell phone 1010 includes an antenna 1012 coupled to a transmitter 1014 a receiver 1016, as well as, a microphone 1018, speaker 1020, keypad 1022, and display 1024. The cell phone 1010 also includes a power supply 1026 and a central processing unit (CPU) 1028, which may be an embedded controller, conventional microprocessor, or the like. In addition, the cell phone 1010 includes integrated, flash memory 1030. Flash memory 1030 includes: a first current-voltage conversion circuit connected to a core cell provided in a nonvolatile memory cell array, a second current-voltage conversion circuit connected to a reference cell through a reference cell data line, a sense amplifier sensing an output from the first current-voltage conversion circuit and an output from the second current-voltage conversion circuit, a compare circuit comparing a voltage level at the reference cell data line with a predefined voltage level, and a charging circuit charging the reference cell data line, if the voltage level at the reference cell data line is lower than the predefined voltage level during pre-charging the reference cell data line. According to the present invention, the pre-charging period of the reference cell data line can be shortened, and the data read time can be shortened.

As a result, the flash memory 1030 is able to operate at a faster rate than conventional flash memory. Consequently, embodiments allow flash memory devices, such as mobile phones, personal digital assistants, set-top boxes, digital video recorders, networking and telecommunication equipments, printers, computer peripherals, automotive navigation devices, and gaming systems to function more efficiently.

Flash memory comes in two primary varieties, NOR-type flash and NAND-type flash. While the general memory storage transistor is the same for all flash memory, it is the interconnection of the memory cells that differentiates the designs. In a conventional NOR-type flash memory, the memory cell transistors are connected to the bit lines in a parallel configuration, while in a conventional NAND-type flash memory, the memory cell transistors are connected to the bit lines in series, For this reason, NOR-type flash is sometimes referred to as "parallel flash" and NAND-type flash is referred to as "serial flash."

Traditionally, portable phone (e.g., cell phone) CPUS have needed only a small amount of integrated NOR-type flash memory to operate. However, as portable phones (e.g., cell phone) have become more complex, offering more features and more services (e.g., voice service, text messaging, camera, ring tones, email, multimedia, mobile TV, MP3, location, productivity software, multiplayer games, calendar, and maps), flash memory requirements have steadily increased.

Thus, a more efficient flash memory will render a portable phone more competitive in the telecommunications market, Also, as mentioned above, flash memory is applicable to a variety of devices other than portable phones. For instance, flash memory can be utilized in personal digital assistants, set-top boxes, digital video recorders, networking and telecommunication equipments, printers, computer peripherals, automotive navigation devices, and gaming systems.

Figure 11:
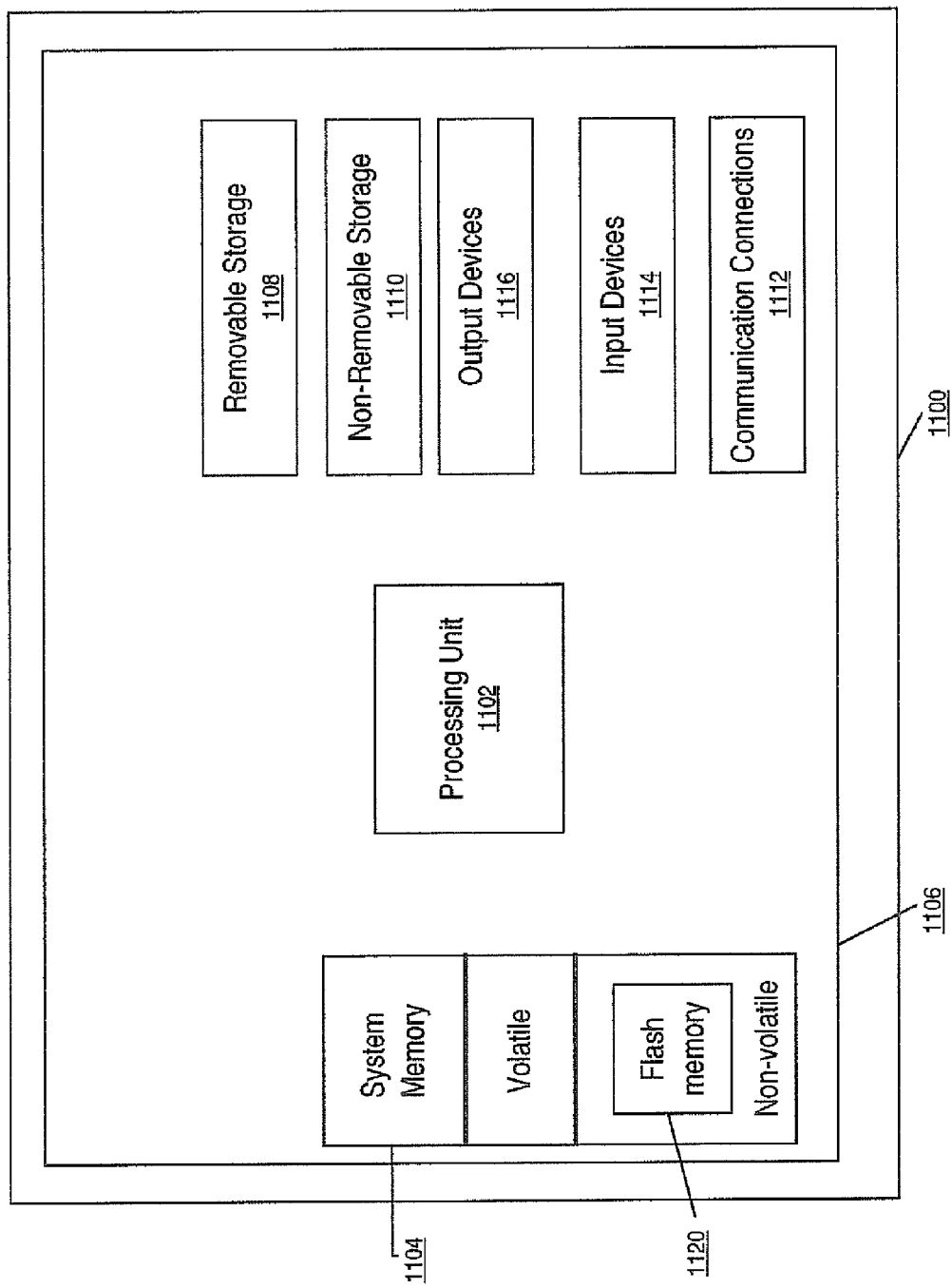
FIG. 11 illustrates a block diagram of a computing device, upon which embodiments of the present claimed subject matter can be implemented.

FIG. 11 illustrates a block diagram of a computing device 1100, upon which embodiments of the present claimed subject matter can be implemented. Although computing device 1100 is shown and described in FIG. 11 as having certain numbers and types of elements, the embodiments are not necessarily limited to the exemplary implementation, That is, computing device 1100 can include elements other than those shown, and can include more than one of the elements that are shown, For example, computing device 1100 can include a greater number of processing units than the one (processing unit 1102) shown. Similarly, in another example, computing device 1100 can include additional components not shown in FIG. 11.

Also, it is important to note that the computing device 1100 can be a variety of things. For example, computing device 1100 can be but are not limited to a personal desktop computer, a portable notebook computer, a personal digital assistant (PDA), and a gaming system. Flash memory is especially useful with small-form-factor computing devices such as PDAs and portable gaming devices. Flash memory offers several advantages. In one example, flash memory is able to offer fast read access times while at the same time being able to withstand shocks and bumps better than standard hard disks, This is important as small computing devices are often moved around and encounters frequent physical impacts. Also, flash memory is more able than other types of memory to withstand intense physical pressure and/or heat, And thus, portable computing devices are able to be used in a greater range of environmental variables.

In its most basic configuration, computing device 1100 typically includes at least one processing unit 1102 and memory 1104. Depending on the exact configuration and type of computing device, memory 1104 may be volatile (such as RAM), non-volatile (such as ROM, flash memory, etc,) or some combination of the two. This most basic configuration of computing device 1100 is illustrated in FIG. 11 by line 1105. Additionally, device 1100 may also have additional features/functionality. For example, device 1100 may also include additional storage (removable and/or non-removable) including, but not limited to, magnetic or optical disks or tape. In one example, in the context of a gaming system, the removable storage could a game cartridge receiving component utilized to receive different game cartridges. In another example, in the context of a Digital Video Disc (DVD) recorder, the removable storage is a DVD receiving component utilized to receive and read DVDs. Such additional storage is illustrated in FIG. 11 by removable storage 1108 and non-removable storage 1110. Computer storage media includes volatile and nonvolatile, removable and non-removable media implemented in any method or technology for storage of information such as computer readable instructions, data structures, program modules or other data. Memory 1104, removable storage 1108 and non-removable storage 1110 are all examples of computer storage media, Computer storage media includes, but is not limited to, RAM, ROM, EEPROM, flash memory 1120 or other memory technology, CD-ROM, digital video disks (DVD) or other optical storage, magnetic cassettes, magnetic tape, magnetic disk storage or other magnetic storage devices, or any other medium which can be used to store the desired information and which can accessed by device 1100. Any such computer storage media may be part of device 1100.

In the present embodiment, the flash memory 1120 comprises: a first current-voltage conversion circuit connected to a core cell provided in a nonvolatile memory cell array, a second current-voltage conversion circuit connected to a reference cell through a reference cell data line, a sense amplifier sensing an output from the first current-voltage conversion circuit and an output from the second current-voltage conversion circuit, a compare circuit comparing a voltage level at the reference cell data line with a predefined voltage level, and a charging circuit charging the reference cell data line, if the voltage level at the reference cell data line is lower than the predefined voltage level during pre-charging the reference cell data line. According to the present invention, the pre-charging period of the reference cell data line can be shortened, and the data read time can be shortened.

As a result, the flash memory 1120 is able to operate at a faster rate than conventional flash memory. Consequently, embodiments allow flash memory devices, such as mobile phones, personal digital assistants, set-top boxes, digital video recorders, networking and telecommunication equipments, printers, computer peripherals, automotive navigation devices, and gaming systems to function more efficiently. Further, in one embodiment, the flash memory 1120 utilizes mirrorbit technology to allow storing of two physically distinct bits on opposite sides of a memory cell.

Device 1100 may also contain communications connection(s) 1112 that allow the device to communicate with other devices. Communications connection(s) 1112 is an example of communication media. Communication media typically embodies computer readable instructions, data structures, program modules or other data in a modulated data signal such as a carrier wave or other transport mechanism and includes any information delivery media, The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. The term computer readable media as used herein includes both storage media and communication media.

Device 1100 may also have input device(s) 1114 such as keyboard, mouse, pen, voice input device, game input device (e.g., a joy stick, a game control pad, and/or other types of game input device), touch input device, etc. Output device(s) 1116 such as a display (e.g., a computer monitor and/or a projection system), speakers, printer, network peripherals, etc., may also be included. All these devices are well know in the art and need not be discussed at length here.

Aside from mobile phones and portable computing devices, flash memory is also widely used in portable multimedia devices, such as portable music players. As users would desire a portable multimedia device to have as large a storage capacity as possible, an increase in memory density would be advantageous. Also, users would also benefit from reduced memory read time.

Figure 12:
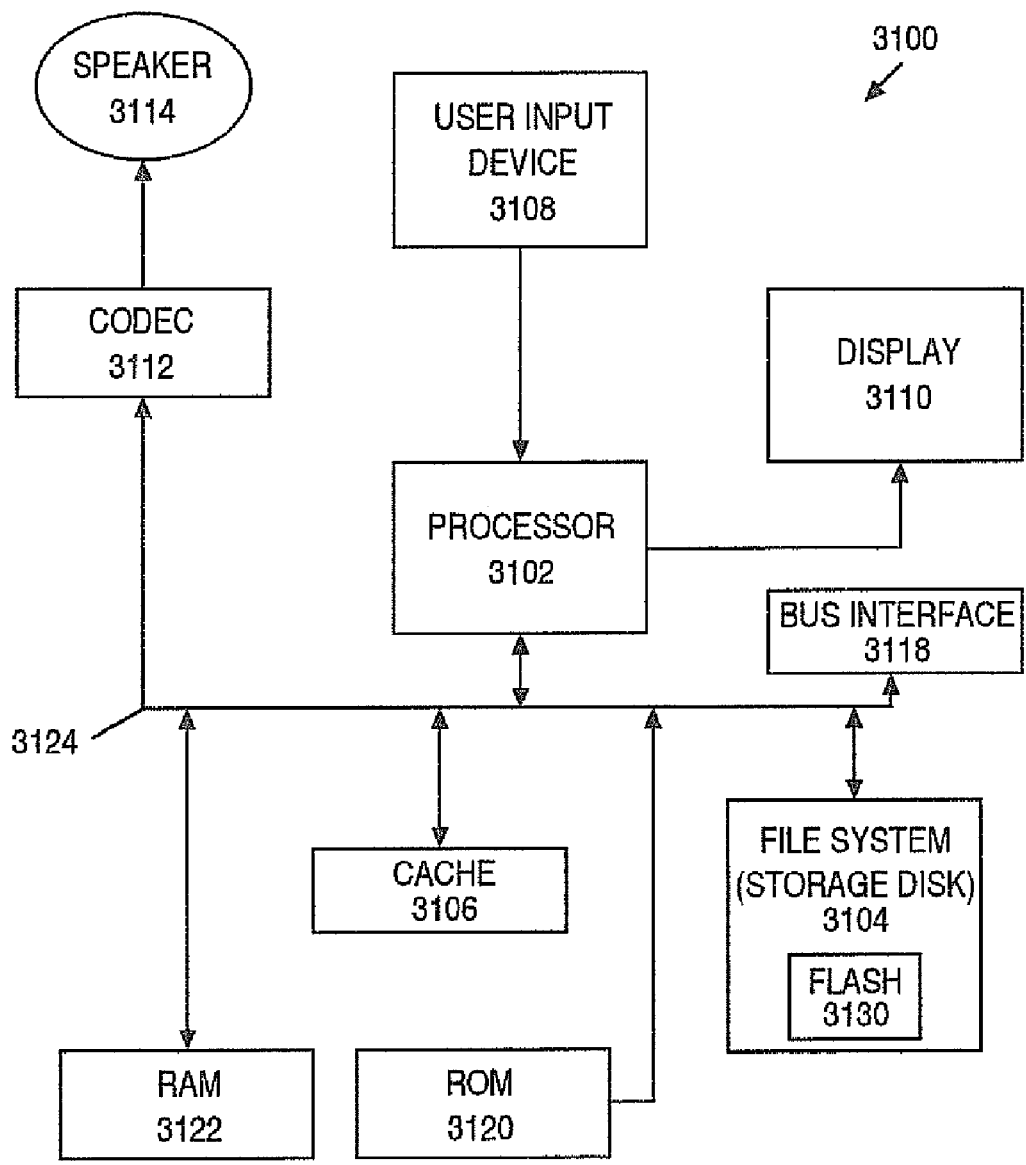
FIG. 12 illustrates an exemplary portable multimedia device, or media player, in accordance with an embodiment of the invention.

FIG. 12 shows an exemplary portable multimedia device, or media player, 3100 in accordance with an embodiment of the invention, The media player 3100 includes a processor 3102 that pertains to a microprocessor or controller for controlling the overall operation of the media player 3100. The media player 3100 stores media data pertaining to media assets in a file system 3104 and a cache 3106. The file system 3104 is, typically, a storage disk or a plurality of disks. The file system 3104 typically provides high capacity storage capability for the media player 3100, Also, file system 3104 includes flash memory 3130. In the present embodiment, the flash memory 3130 comprises: a first current-voltage conversion circuit connected to a core cell provided in a nonvolatile memory cell array, a second current-voltage conversion circuit connected to a reference cell through a reference cell data line, a sense amplifier sensing an output from the first current-voltage conversion circuit and an output from the second current-voltage conversion circuit, a compare circuit comparing a voltage level at the reference cell data line with a predefined voltage level, and a charging circuit charging the reference cell data line, if the voltage level at the reference cell data line is lower than the predefined voltage level during pre-charging the reference cell data line, According to the present invention, the pre-charging period of the reference cell data line can be shortened, and the data read time can be shortened.

As a result, the flash memory 3130 is able to operate at a faster rate than conventional flash memory. Consequently, embodiments allow flash memory devices, such as mobile phones, personal digital assistants, set-top boxes, digital video recorders, networking and telecommunication equipments, printers, computer peripherals, automotive navigation devices, and gaming systems to function more efficiently. However, since the access time to the file system 3104 is relatively slow, the media player 3100 can also include a cache 3106. The cache 3106 is, for example, Random-Access Memory (RAM) provided by semiconductor memory. The relative access time to the cache 3106 is substantially shorter than for the file system 3104. However, the cache 3106 does not have the large storage capacity of the file system 3104. Further, the file system 3104, when active, consumes more power than does the cache 3105. The power consumption is particularity important when the media player 3100 is a portable media player that is powered by a battery (not shown). The media player 3100 also includes a RAM 3120 and a Read-Only Memory (ROM) 3122, The ROM 3122 can store programs, utilities or processes to be executed in a nonvolatile manner. The RAM 3120 provides volatile data storage, such as for the cache 3106.

The media player 3100 also includes a user input device 3108 that allows a user of the media player 3100 to interact with the media player 3100. For example, the user input device 3108 can take a variety of forms, such as a button, keypad, dial, etc. Still further, the media player 3100 includes a display 3110 (screen display) that can be controlled by the processor 3102 to display information to the user. A data bus 3124 can facilitate data transfer between at least the file system 3104, the cache 3106, the processor 3102, and the CODEC 3110. The media player 3100 also includes a bus interface 3116 that couples to a data link 3118. The data link 3118 allows the media player 3100 to couple to a host computer.

In one embodiment, the media player 3100 serves to store a plurality of media assets (e.g., songs) in the file system 3104, When a user desires to have the media player play a particular media item, a list of available media assets is displayed on the display 3110. Then, using the user input device 3108, a user can select one of the available media assets, The processor 3102, upon receiving a selection of a particular media item, supplies the media data (e.g. audio file) for the particular media item to a coder/decoder (CODEC) 3110, The CODEC 3110 then produces analog output signals for a speaker 3114. The speaker 3114 can be a speaker internal to the media player 3100 or external to the media player 3100.

For example, headphones or earphones that connect to the media player 3100 would be considered an external speaker.

For example, in a particular embodiment, the available media assets pre arranged in a hierarchical manner based upon a selected number and type of groupings appropriate to the available media assets. For example, in the case where the media player 3100 is an MP3 type media player, the available media assets take the form of MP3 files (each of which corresponds to a digitally encoded song or other audio rendition) stored at least in part in the file system 3104. The available media assets (or in this case, songs) can be grouped in any manner deemed appropriate. In one arrangement, the songs can be arranged hierarchically as a list of music genres at a first level, a list of artists associated with each genre at a second level, a list of albums for each artist listed in the second level at a third level, while at a fourth level a list of songs for each album listed in the third level, and so on.

According to an exemplary embodiment of the present invention, the time needed for stabilizing the output signals (REFBIAS and SAREF) of the second current-voltage conversion circuit 100 is shorter than that of the conventional technique by a time tr1 (approximately 25 ns), Accordingly, it is possible to shorten the timing of making SAI_SET to a low level by the time tn. This enables the sense period to be shortened by the time tn.

The flash memory employed in the second embodiment is capable of storing multiple bits in the core cell, and is a SONOS type flash memory employing a virtual ground array method. In addition, the flash memory employed in the second embodiment has a memory cell array to be used as a NOR type. The flash memory employed in the second embodiment utilizes a memory cell array for use in a NOR type, and has an interface of a NAND flash memory (NAND I/F). In particular, the load in the output from the second current-voltage conversion circuit 100 becomes greater. It is therefore possible to bring about a great effect by applying the present invention.

Although a few preferred embodiments of the present invention have been shown and described, it would be appreciated by those skilled in the art that changes may be made in these embodiments without departing from the principles and spirit of the invention, the scope of which is defined in the claims and their equivalents. For example, the present invention is applicable to a flash memory having a floating gate other than SONOS type.

According to an aspect of the present invention, there is preferably provided a semiconductor device including: a first current-voltage conversion circuit connected to a core cell provided in a nonvolatile memory cell array; a second current-voltage conversion circuit connected to a reference cell through a reference cell data line; a sense amplifier sensing an output from the first current-voltage conversion circuit and an output from the second current-voltage conversion circuit; a compare circuit comparing a voltage level at the reference cell data line with a predefined voltage level; and a charging circuit charging the reference cell data line, if the voltage level at the reference cell data line is lower than the predefined voltage level during pre-charging the reference cell data line, According to the present invention, when the reference cell data line is pre-charged, not only the second current-voltage conversion circuit but also the charge circuit charge the reference cell data line. This enables the reference cell data line to be pre-charged at high speed. Accordingly, it is possible to provide a semiconductor device in which a data read time can be shortened.

In the above-described semiconductor device, the charging circuit may include a FET having a gate connected to an output from the compare circuit and a source and a drain respectively connected to a voltage source and the reference cell data line. According to the present invention, it is possible to compose the change circuit with ease.

In the above-described semiconductor device, the second current-voltage conversion circuit may have a differential circuit to which the voltage level at the reference cell data line and the predefined voltage level are input; the compare circuit may have a first FET having a gate connected to an output from the differential circuit and a source and drain connected to a voltage source and an output node and a second FET having a gate connected to a gate of a current source FET in the differential circuit and a source and a drain connected to the output node and a ground level; and an output of the compare circuit may be connected to the output node. According to the present invention, it is possible to compose a compare circuit with ease, by utilizing the output from the differential circuit of the second current-voltage conversion circuit.

In the above-described semiconductor device, the pre-defined voltage level may be lower than a target voltage level for pre-charging the reference cell data line, According to the present invention, the charge circuit can be operated appropriately when the voltage level of the reference cell data line is lower than a target voltage level and the charging by the charge circuit is demanded, In the above-described semiconductor device, the second current-voltage conversion circuit may have an average circuit averaging outputs from multiple reference cells, and the second current-voltage conversion circuit outputs an output from the average circuit. According to the present invention, it is possible to determine the data in the core cell with more accuracy, by providing multiple reference cells and averaging the outputs therefrom to set to the outputs from the second current-voltage conversion circuit.

in the above-described semiconductor device, the second current-voltage conversion circuit may output an output thereof to the first current-voltage conversion circuit and to the sense amplifier; and the first current-voltage conversion circuit differentially amplifies the output from the core cell and the output from second current-voltage conversion circuit to output to the sense amplifier. According to the present invention, it is possible to amplify the difference between the data en the core cell side and that on the reference cell side, before the final amplifying operation is performed, thereby enabling the data to be read out of the core cell with more certainty, in the above-described semiconductor device, the average circuit may have a first average circuit outputting to the first current-voltage conversion circuit, and a second average circuit outputting an output thereof to the sense amplifier. According to the present invention, it is possible to prevent a noise of one of the outputs from the average circuit from influencing the other.

The above-described semiconductor device may further include a sense control circuit making the sense amplifier start sensing after pre-charging of the reference cell data is finished. According to the present invention, a sense operation can be performed on the sense amplifier, after the pre-charging of the reference cell data line is completed. Accordingly, it is possible to realize accurate sensing at high speed.

In the above-described semiconductor device, the sense control circuit may make the sense amplifier start sensing by outputting from the first current-voltage conversion circuit. According to the present invention, by turning on the output from the first current-voltage conversion circuit, after the reference cell data line is finished pre-charging, the sense amplifier is capable of sensing with the use of the voltage on the reference side in a stable condition. Therefore, more accurate and high speed sensing can be realized.

In the above-described semiconductor device, the sense control circuit may include a FET connected between the output from the first current-voltage conversion circuit and a voltage source, According to the present invention, it is possible to compose a sense control circuit with ease, in the above-described semiconductor device, the nonvolatile memory cell array may have a SONOS memory cell. According to the present invention, the data read time can be shortened in a SONOS type flash memory.

In the above-described semiconductor device, a plurality of bits can be stored in the core cell. According to the present invention, the data read time can be shortened in a flash memory having a cell in which multiple bits can be stored According to another aspect of the invention, there is provided a method of controlling a semiconductor device including: comparing a voltage level at a reference cell data line with a predefined voltage level; and charging the reference cell data line, if the voltage level at the reference cell data line is lower than the predefined voltage level during pre-charging the reference cell data line, the semiconductor device including a first current-voltage conversion circuit connected to a core cell provided in a nonvolatile memory cell array, a second current-voltage conversion circuit connected to the reference cell through a reference cell data line, and a sense amplifier sensing an output from the first current-voltage conversion circuit and an output from the second current-voltage conversion circuit. According to the present invention, when the reference cell data line is pre-charged, not only the second current-voltage conversion circuit but also the charge circuit charge the reference cell data line. This enables the reference cell data line to be pre-charged at high speed. Accordingly, it is possible to provide a semiconductor device in which a data read time can be shortened.

The above-described method may further include averaging outputs from multiple reference cells, and the second current-voltage conversion circuit may output an output from an average circuit. According to the present invention, outputs from multiple reference cells are averaged to set as an output of the second current-voltage conversion circuit, thereby enabling the data in the core cell to be determined with more accuracy.

The above-described method may further include starting sensing after pre-charging of the reference cell data line is finished. According to the present invention, after the reference cell data line is finished pre-charging, the sense amplifier is capable of sensing. It is therefore possible to realize accurate and high-speed sense operation.

According to the present invention, it is possible to provide a semiconductor device and a control method therefor, in which it is possible to shorten the pre-charging time of the reference cell data line and to shorten the data read time.

Although a few preferred embodiments of the present invention have been shown and described, it would be appreciated by those skilled in the art that changes may be made in these embodiments without departing from the principles and spirit of the invention, the scope of which is defined in the claims and their equivalents. The non-volatile semiconductor memory device has been described in the above-mentioned embodiments as an example. However, the present invention is applicable to a semiconductor device having the non-volatile semiconductor memory device mounted thereon.

What is claimed is:

1. A wireless communications device, said wireless communications device comprising:
a flash memory comprising:
a first current-voltage conversion circuit connected to a core cell provided in a nonvolatile memory cell array;
a second current-voltage conversion circuit connected to a reference cell through a reference cell data line, wherein the second current-voltage conversion circuit comprises an average circuit operable to average outputs from multiple reference cells;
a sense amplifier sensing an output from the first current-voltage conversion circuit and an output from the second current-voltage conversion circuit;
a compare circuit comparing a voltage level at the reference cell data line with a predefined voltage level; and
a charging circuit charging the reference cell data line, if the voltage level at the reference cell data line is lower than the predefined voltage level during pre-charging the reference cell data line;
a processor;
a communications component;
a transmitter;
a receiver; and
an antenna connected to the transmitter circuit and the receiver circuit.

2. The flash memory of claim 1, wherein the second current-voltage conversion circuit outputs an output from the average circuit.

3. The flash memory of claim 1, wherein:
the second current-voltage conversion circuit has a differential circuit to which the voltage level at the reference cell data line and the predefined voltage level are input;
the compare circuit has a first FET having a gate connected to an output from the differential circuit and a source and drain connected to a voltage source and an output node and a second FET having a gate connected to a gate of a current source FET in the differential circuit and a source and a drain connected to the output node and a ground level; and
an output of the compare circuit is connected to the output node.

4. The flash memory of claim 1, wherein the average circuit has a first average circuit outputting to the first current-voltage conversion circuit, and a second average circuit outputting an output thereof to the sense amplifier.

5. The wireless communications device of claim 1, wherein said flash memory is NAND flash memory.

6. The wireless communications device of claim 1, wherein said flash memory is NOR flash memory.

7. The wireless communications device of claim 1, wherein said flash memory utilizes mirrorbits technology.

8. A portable media player comprising:
a processor;
a cache;
a user input component;
a coder-decoder component; and
a memory comprising:
a flash memory comprising:
a first current-voltage conversion circuit connected to a core cell provided in a nonvolatile memory cell array;
a second current-voltage conversion circuit connected to a reference cell through a reference cell data line, wherein the second current-voltage conversion circuit comprises an average circuit operable to average outputs from multiple reference cells;
a sense amplifier sensing an output from the first current-voltage conversion circuit and an output from the second current-voltage conversion circuit;
a compare circuit comparing a voltage level at the reference cell data line with a predefined voltage level; and
a charging circuit charging the reference cell data line, if the voltage level at the reference cell data line is lower than the predefined voltage level during pre-charging the reference cell data line.

9. The portable media player of claim 8, wherein said portable media player is a portable music player.

10. The portable media player of claim 8, wherein said portable media player is a portable video player.

11. The flash memory of claim 8, wherein the second current-voltage conversion circuit outputs an output from the average circuit.

12. The flash memory of claim 8, wherein:
the second current-voltage conversion circuit has a differential circuit to which the voltage level at the reference cell data line and the predefined voltage level are input;
the compare circuit has a first FET having a gate connected to an output from the differential circuit and a source and drain connected to a voltage source and an output node and a second FET having a gate connected to a gate of a current source FET in the differential circuit and a source and a drain connected to the output node and a ground level; and
an output of the compare circuit is connected to the output node.

13. The flash memory of claim 8, wherein the average circuit has a first average circuit outputting to the first current-voltage conversion circuit, and a second average circuit outputting an output thereof to the sense amplifier.

* * * * *